(12) United States Patent
Enta

(10) Patent No.: US 7,498,795 B2
(45) Date of Patent: Mar. 3, 2009

(54) ELECTROSTATIC DISCHARGE DEVICE TESTING SYSTEM AND METHOD

(75) Inventor: Roger Enta, Waterloo (CA)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 11/445,258

(22) Filed: Jun. 2, 2006

(65) Prior Publication Data

US 2007/0279036 A1 Dec. 6, 2007

(51) Int. Cl.
G01R 19/00 (2006.01)
G01R 29/12 (2006.01)
G01R 27/08 (2006.01)

(52) U.S. Cl. .......................... 324/66; 324/457; 324/691

(58) Field of Classification Search .................... 324/66, 324/691
See application file for complete search history.

(56) References Cited

U.S. PATENT DOCUMENTS

| 5,083,117 | A | | 1/1992 | Hoigaard |
| 5,325,068 | A | * | 6/1994 | Rauf ........................... 324/713 |
| 5,969,626 | A | | 10/1999 | Maciel |
| 6,052,053 | A | | 4/2000 | Jubin et al. |
| 6,510,987 | B1 | | 1/2003 | Henggriprasopchoke et al. |
| 6,809,522 | B2 | * | 10/2004 | Nguyen ........................ 324/457 |
| 2003/0080748 | A1 | * | 5/2003 | Newman ...................... 324/458 |
| 2003/0201778 | A1 | * | 10/2003 | Kraz ............................ 324/458 |
| 2003/0234651 | A1 | | 12/2003 | Nguyen |
| 2004/0169516 | A1 | * | 9/2004 | Kraz ............................ 324/457 |
| 2004/0251907 | A1 | * | 12/2004 | Kalley ......................... 324/426 |
| 2006/0084342 | A1 | * | 4/2006 | Austin et al. ................. 442/361 |

FOREIGN PATENT DOCUMENTS

| EP | 0580913 A | 2/1994 |
| WO | 99/09792 A | 2/1999 |
| WO | 99/28754 A | 6/1999 |

* cited by examiner

Primary Examiner—Timothy J Dole
Assistant Examiner—Jeff Natalini
(74) Attorney, Agent, or Firm—Fasken Martineau

(57) ABSTRACT

There is disclosed an electrostatic discharge (ESD) device tester and a method of operating the tester. In an embodiment, the method comprises operating the tester by uniquely identifying an ESD device to be tested using identification means provided on the tester; taking at least one test measurement of the uniquely identified ESD device using testing means provided on the tester, the testing means being configurable in dependence upon data associated with the uniquely identified ESD device; and storing the at least one test measurement in a storage means provided in the tester. A running average of test measurements for the uniquely identified ESD device may be stored on the tester in order to compare a test measurement against the running average. A test is repeated if a test measurement falls outside of a predetermined range of the running average.

20 Claims, 6 Drawing Sheets

| Barcode | ESD Device | Voltage Setting for Surface Test 10V/100V | Last Recorded Surface Test Measurement MΩ | Current Surface Test Measurement MΩ |
|---|---|---|---|---|
| 312a | Conveyor 302 | 100V | 2.3E8 | 2.5E8 |
| 312b | ESD table 304 | 100V | 1.5E8 | 1.4E8 |
| 312c | ESD safe mat 306 | 100V | 1.0E8 | 1.2E8 |
| 312d | ESD flooring 308 | 100V | 2.5E8 | 2.6E8 |
| 312e | Conveyor 310 | 100V | 2.1E8 | 1.9E8 |

ELECTROSTATIC DISCHARGE DEVICE TESTING SYSTEM AND METHOD

FIELD OF THE INVENTION

The present invention relates generally to the field of electrostatic discharge (ESD) testing systems and methods.

BACKGROUND

Monitoring and controlling electrostatic discharge or ESD is an important function in electronics manufacturing, since uncontrolled discharge may seriously damage ESD-sensitive components. Damage often occurs at a microscopic level, such that the actual damage to a component may only be discovered in testing after manufacture, or after premature failure experienced by an end user.

Various ESD monitoring devices and ESD protection devices are available to help manage the risk of ESD during manufacturing and assembly of sensitive electronic components and devices. For example, an ESD monitoring device may monitor environmental conditions such as temperature and humidity, and may trigger an alarm if these conditions fall outside a preferred operating range. An ESD protection device may include, for example, an ESD safe mat for neutralizing static charge on the table of an electronics assembly station. Another example of an ESD protection device is an ESD floor mat or flooring that may be used for electrically grounding an operator that may touch sensitive electronic components and devices during assembly.

In order to ensure that the ESD monitoring and protection devices within an electronics manufacturing or assembly facility are functioning properly, it is desirable to test them at regular intervals using ESD device testers. A device tester commonly used for this purpose is a megohmmeter that may be used to measure the resistance of an ESD monitoring or protection device. The resistance measured by the megohmmeter may provide an indication of the potential of an ESD monitoring or protection device to prevent ESD.

Presently, to test these various ESD monitoring and protection devices, an ESD specialist typically sets the megohmmeter to take a resistance measurement for an ESD monitoring or protection device, obtains a resistance measurement, and logs the measurement on a log sheet. This is repeated for each and every device. While functional, this approach can become tedious and cumbersome when many devices must be tested at a facility.

What are needed are systems and methods for more efficiently testing and obtaining measurements for ESD monitoring or protection devices.

BRIEF DESCRIPTION OF THE DRAWINGS

In the figures which illustrate exemplary embodiments of the invention.

DETAILED DESCRIPTION

As noted above, the present invention relates to electrostatic discharge monitoring systems and methods.

Figure 1A:
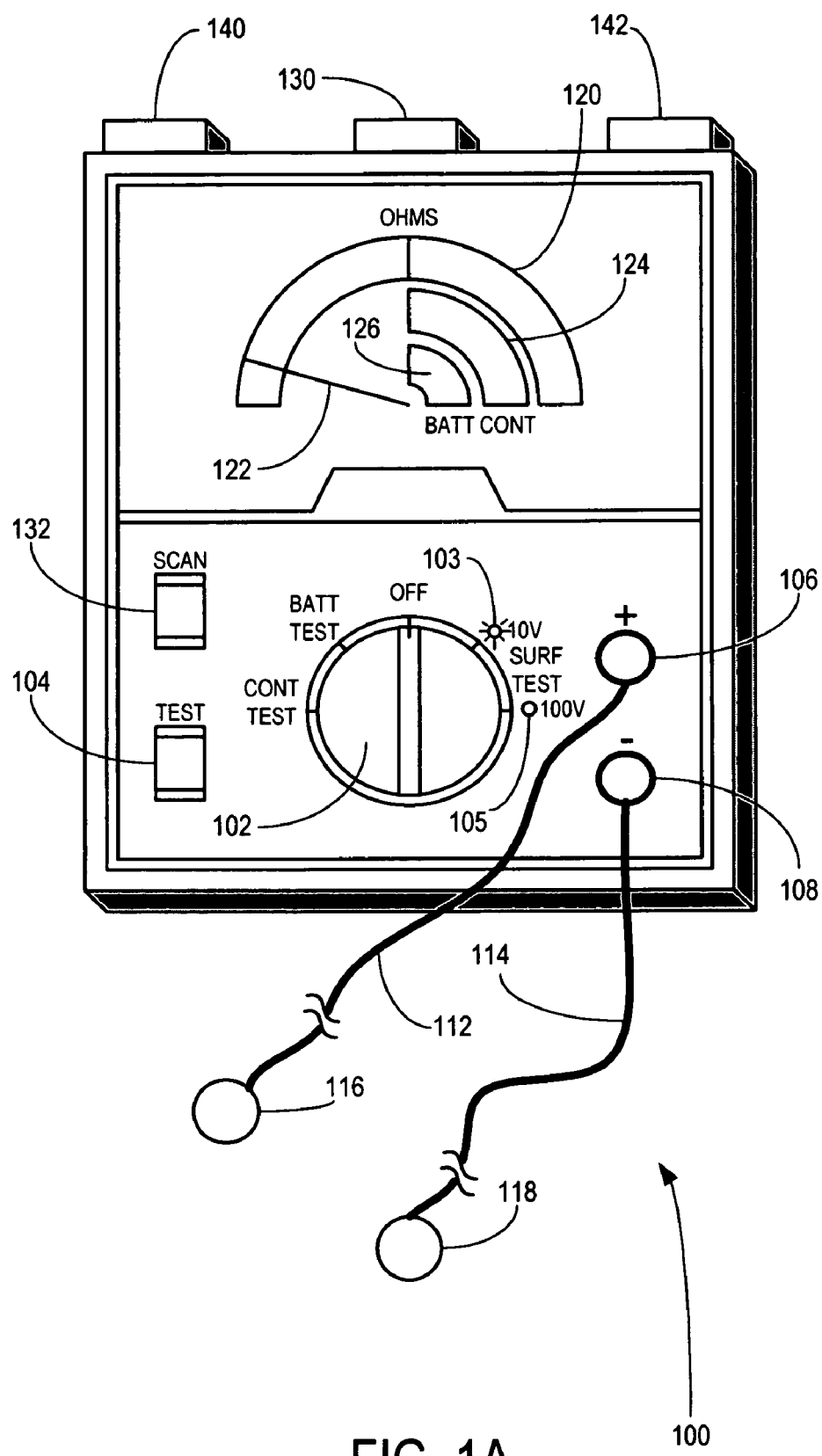
FIG. 1A is an illustration of an ESD device tester in accordance with an embodiment.

Shown in FIG. 1A is an illustration of an ESD device tester 100 in accordance with an embodiment. ESD device tester 100 may be, for example, a megohmmeter for measuring the resistance of an ESD device. Any suitable megohmmeter may be used. As an example, ESD device tester 100 may be a suitably modified version of the 3M™ Model 701 Megohmmeter manufactured by 3M Electronic and Interconnect Solutions Division of Austin, Tex.

ESD device tester 100 may include a selector switch 102 for selecting one of a plurality of testing modes including, for example, a continuity test mode, a battery test mode, a 10V surface test mode, and a 100V surface test mode. Selector switch 102 may also be used to place ESD device tester 100 into an "off" mode. The battery test mode may be used to test the internal battery powering the ESD device tester 100. The continuity test mode may be used to test the leads 112, 114 to determine if they are functioning properly. Finally, the surface test mode may be used to test the resistance measurement of a surface to be tested. Light emitting diodes or LEDs 103, 105 may be used to identify the appropriate setting to be used, as described further below. These test modes will be described in greater detail below.

Still referring to FIG. 1A, ESD device tester 100 may include a test button to activate the test function selected using selector 102. Testing may be performed using test leads 112, 114 connected to positive and negative terminals 106 and 108, respectively. At the opposite end of the test leads 112, 114, a pair of contact pads 116, 118 may be provided to make contact with a target surface to be measured. Once the test leads 112, 114 have been connected using contact pads 116, 118 to appropriate locations on a target surface and a test measurement has been taken by actuating test button 104, the result may be read on a user interface/display provided on the megohmmeter. For example, an indicator 122 may be configured to move along one of the scales 120, 124, 126 provided. If a surface test is being conducted, the measurement may be indicated by movement of an indicator 122 along the megohmmeter resistance scale 120. If a continuity test is being conducted, the measurement indicated by movement of the indicator 122 along the continuity scale 124 may be used. Finally, for battery testing, the measurement may be indicated by movement of the indicator 122 along the battery scale 126.

Still referring to FIG. 1A, shown is a barcode-reader 130 that may be integrated into ESD device tester 100 and used to scan a unique barcode label provided on each ESD device to be tested using device tester 100. Alternatively, a radio frequency identification (RFID) tag reader may be used to read RFID tags provided in each ESD device to be tested. These identification means will be described in more detail further below.

In addition to the barcode reader 130, ESD device tester 100 may further include a temperature sensor 140 and a humidity sensor 142. Temperature sensor 140 and humidity sensor 142 may be used to test environmental conditions in the immediate vicinity of an ESD device being tested. These sensors 140, 142 may be used independently, or alternatively may be activated at the same time that barcode reader 130 is activated using scan button 132, for example.

Figure 1B:
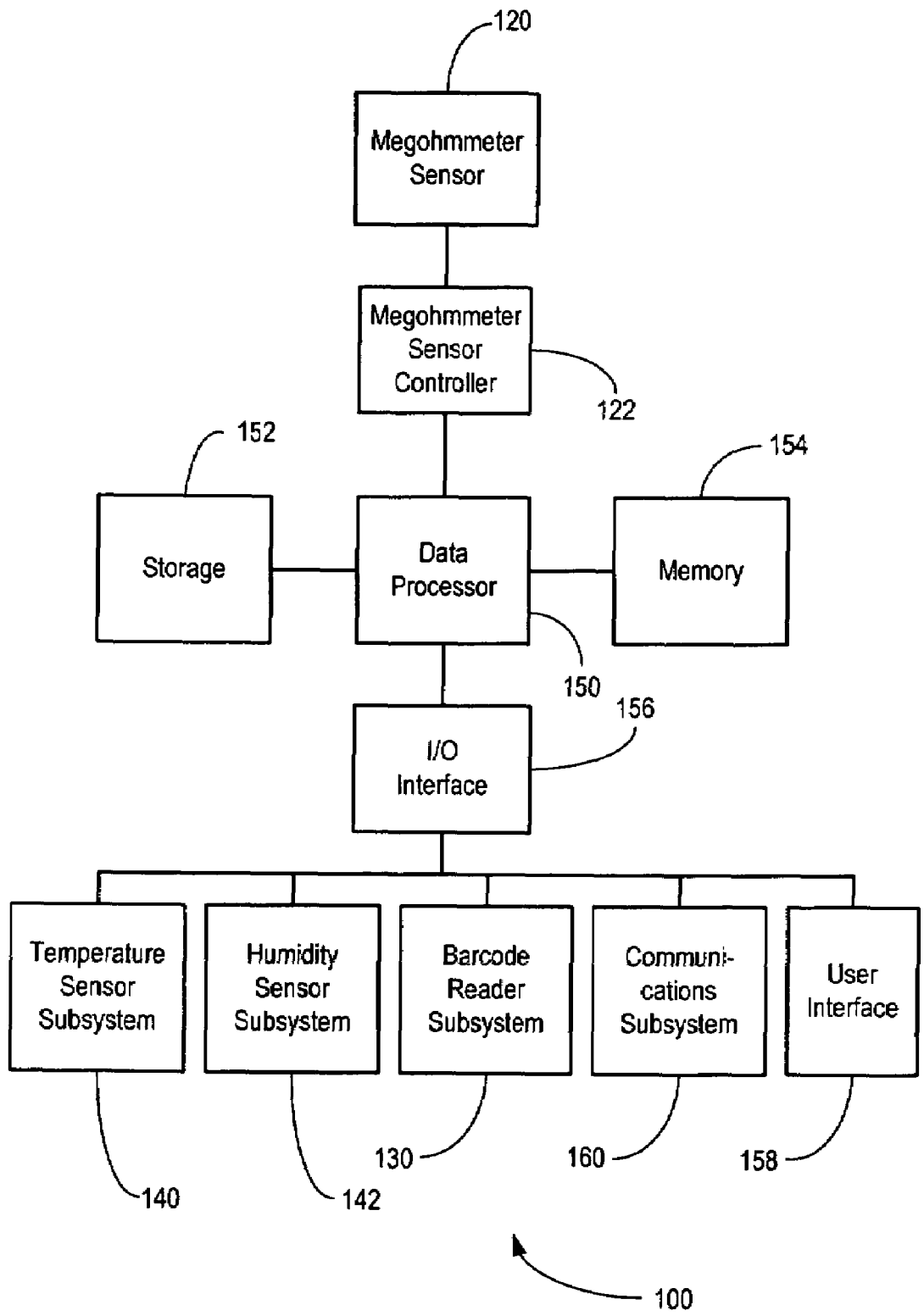
FIG. 1B is a schematic block diagram of the ESD device tester of FIG. 1A.

FIG. 1B shows a schematic block diagram of various components of the ESD device tester 100 of FIG. 1A. By way of example, ESD device tester 100 may include a megohmmeter sensor 120 suitably configured to perform surface tests as previously described. Megohmmeter sensor 120 may be operatively connected by a suitable interface controller 122 to data processor 150. Data processor 150 may be operatively connected to storage 152 and to memory 154. Memory 154 may be a suitable random access memory for temporarily storing data required by data processor 150. Storage 152 may be a non-volatile storage that may be used as an input or produced as an output by data processor 150. Data processor 150 may also be operatively connected via an I/O interface 156 to a user interface 158, a barcode reader subsystem 130, and a wireless communications subsystem 160.

User interface 158 may incorporate a suitable display viewable by an ESD specialist which may be, for example, an analog dial as shown in FIG. 1A. The display may alternatively be a suitable digital graphical display to provide the ESD specialist with multiple pieces of information.

Figure 2:
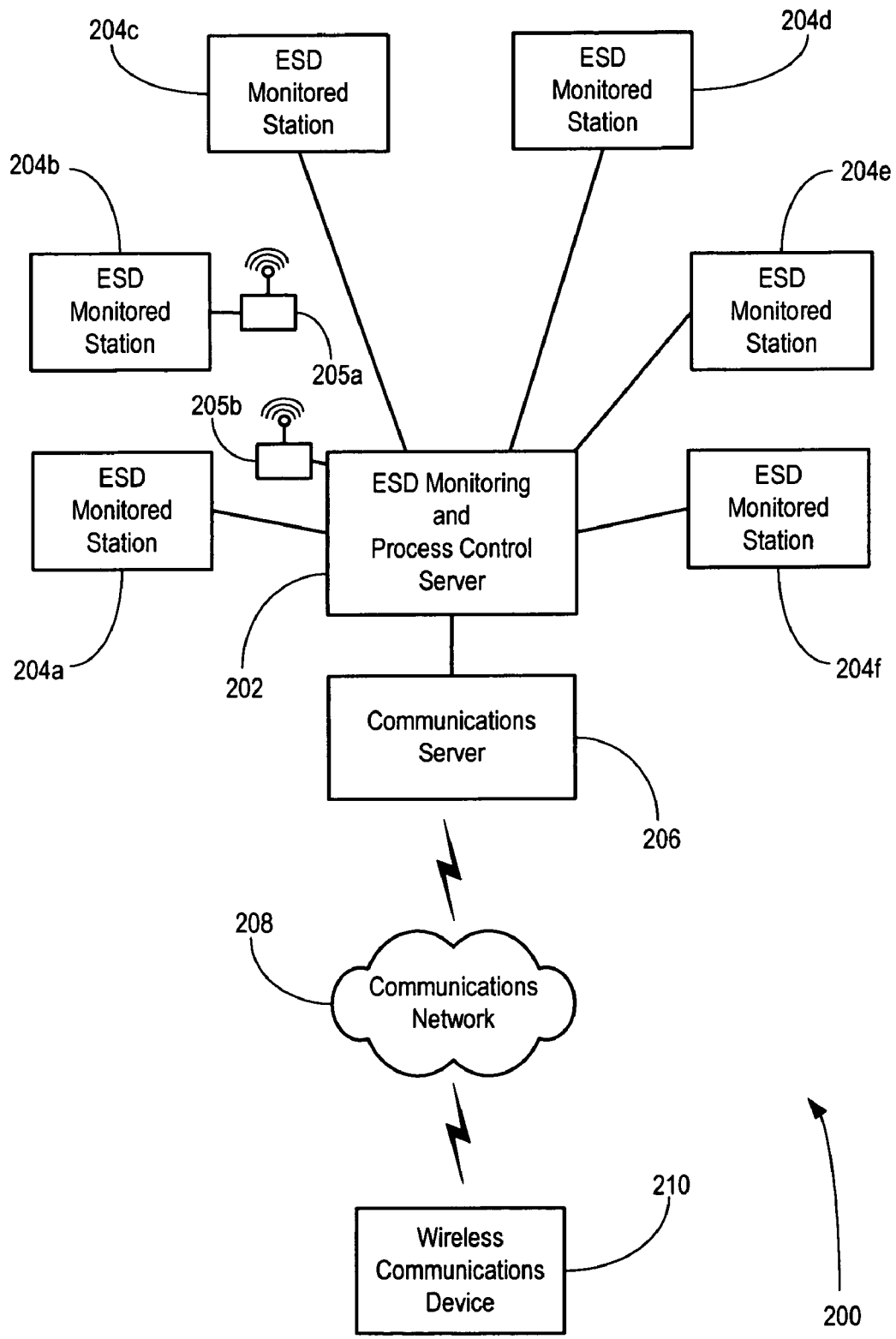
FIG. 2 is a schematic diagram of an electronics manufacturing/assembly facility having a plurality of ESD monitoring and protection devices.

FIG. 2 is a schematic diagram of an electronics manufacturing/assembly facility 200 having a plurality of ESD monitoring and protection devices. For example, facility 200 may comprise an electronics assembly line having a plurality of ESD monitored stations 204a-204f. ESD monitored stations 204a-204f may be operatively connected to and controlled by an ESD monitoring and process control server 202. Certain ESD monitored stations (e.g. 204b) may be operatively connected to ESD monitoring and processor control server 202 using a pair of transceivers 205a, 205b. ESD monitoring and process control server 202 may also be operatively connected to a communications server 206. Communications server 206 may be operatively connected via a communications network 208 to a mobile communications device 210. As will be further explained below, in an embodiment, ESD device tester 100 may be enabled for wireless communications with ESD monitoring and process control server 202.

Figure 3:
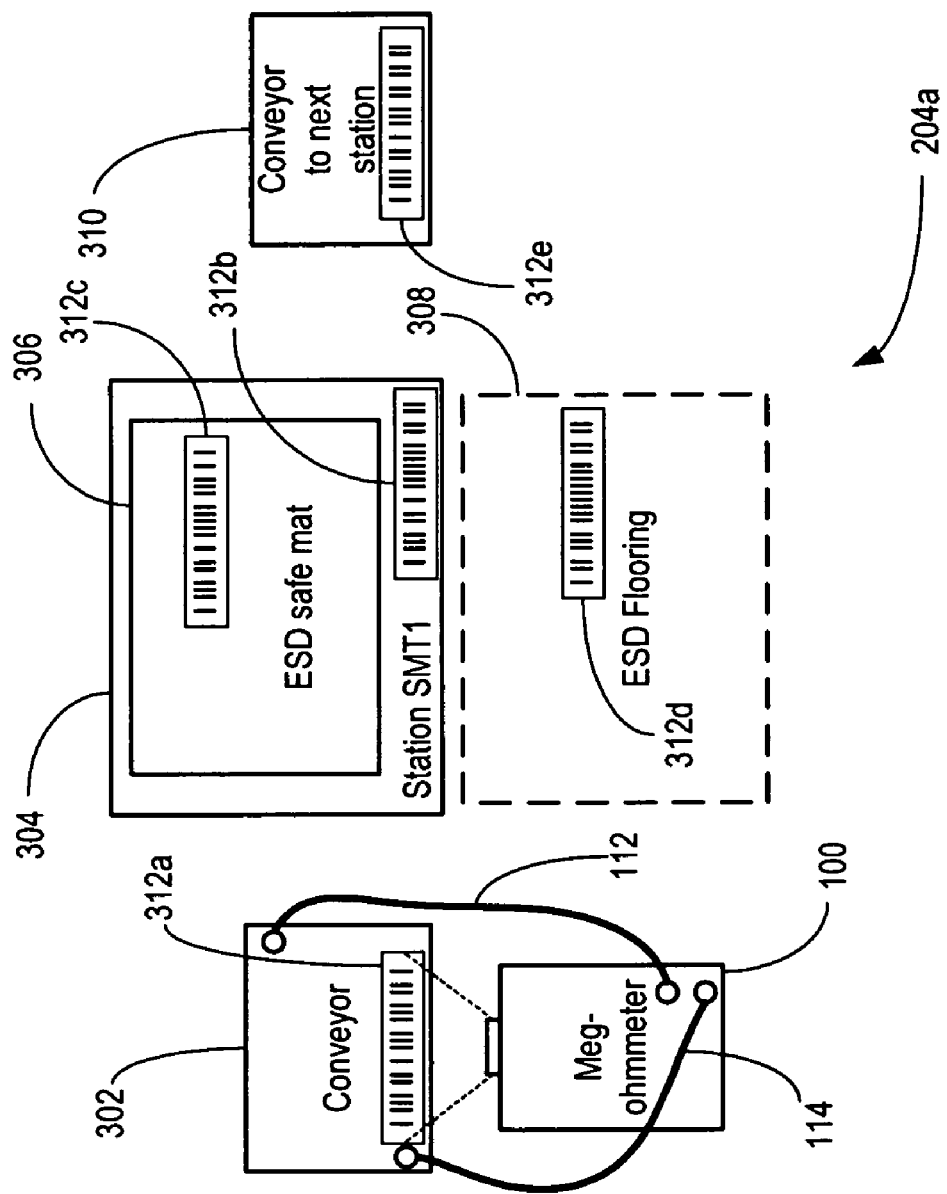
FIG. 3 is a schematic diagram of one of the stations in the facility of FIG. 2 configured for testing using the system of FIGS. 1A & 1B in accordance with an embodiment.

Now referring to FIG. 3, shown is a schematic diagram of one of the stations (e.g. 204a) in the facility 200 in FIG. 2. As shown, each ESD device located at station 204a is uniquely identified using a barcode label. For example, a conveyor 302 which delivers an electronics assembly to station 204a may be identified using a barcode label 312a. Similarly, ESD table 304 may be uniquely identified using barcode label 312b, ESD safe mat 306 may be uniquely identified using barcode label 312c, ESD flooring 308 may be uniquely identified using barcode label 312d, and conveyer 310 to the next station may be uniquely identified using barcode label 312e.

Still referring to FIG. 3, ESD device tester 100 may be used to test each device 302, 304, 306, 308, 310 at station 204a. In accordance with an embodiment, prior to testing each ESD device 302, 304, 306, 308, 310, the barcode reader subsystem 130 of ESD device tester 100 may be used to uniquely identify the ESD device. For example, as shown earlier in FIG. 1A, scan button 132 may be actuated to initiate a barcode scan using barcode reader subsystem 130.

By uniquely identifying the ESD device to be tested, ESD device tester 100 can be configured to record a subsequent surface test measurement and associate that surface test measurement to that specific device. For example, as shown in FIG. 3, ESD device tester 100 is reading barcode 312a which uniquely identifies conveyor 302. Test leads 112, 114 are shown connected to suitable connection points on conveyor 302. Upon selecting the type of test to be conducted using the ESD device tester 100, the measurement taken at conveyor 302 using megohmmeter sensor 120 (FIG. 1B) may be processed by data processor 150, and stored in non-volatile storage 152.

In an embodiment, non-volatile storage 152 may store code that when loaded into data processor 150 configures the data processor 150 to uniquely identify the ESD device 302, 304, 306, 308, 310 being tested, and to retrieve from storage (e.g. storage 152) data associated with that unique ESD device. Storage 152 may store data that specifies one or more operational settings in ESD device tester 100. For example, if a particular ESD device requires a certain voltage setting for proper operation (e.g. 10V or 100V surface test), ESD device tester 100 may be configured to retrieve the necessary setting. If the voltage setting is to be done automatically, this setting on ESD device tester 100 may be configured to be adjustable without manually turning selector 102 (FIG. 1). Alternatively, a suitable indicator, such as an LED (e.g. LED 103 or 105 of FIG. 1), may be used to indicate the appropriate voltage setting to be used for the particular ESD device 302, 304, 306, 308, 310.

In an embodiment, in addition to providing specific settings to be used by ESD device tester 100, ESD device tester 100 may also store historical information for test measurements of that device. For example, as will be explained in more detail below, storage 152 of ESD device tester 100 may be used to store the last measured test value for the ESD device 302, 304, 306, 308, 310. In an embodiment, ESD device tester 100 may also be used to identify any significant discrepancy from a previously stored test measurement for a particular ESD device, indicating a possible problem with the ESD device 302, 304, 306, 308, 310, the ESD device tester 100, or perhaps that the test was not properly done. In this manner, the ESD specialist may be alerted immediately so that another confirmation test may be taken using the ESD device tester 100.

Figure 4:
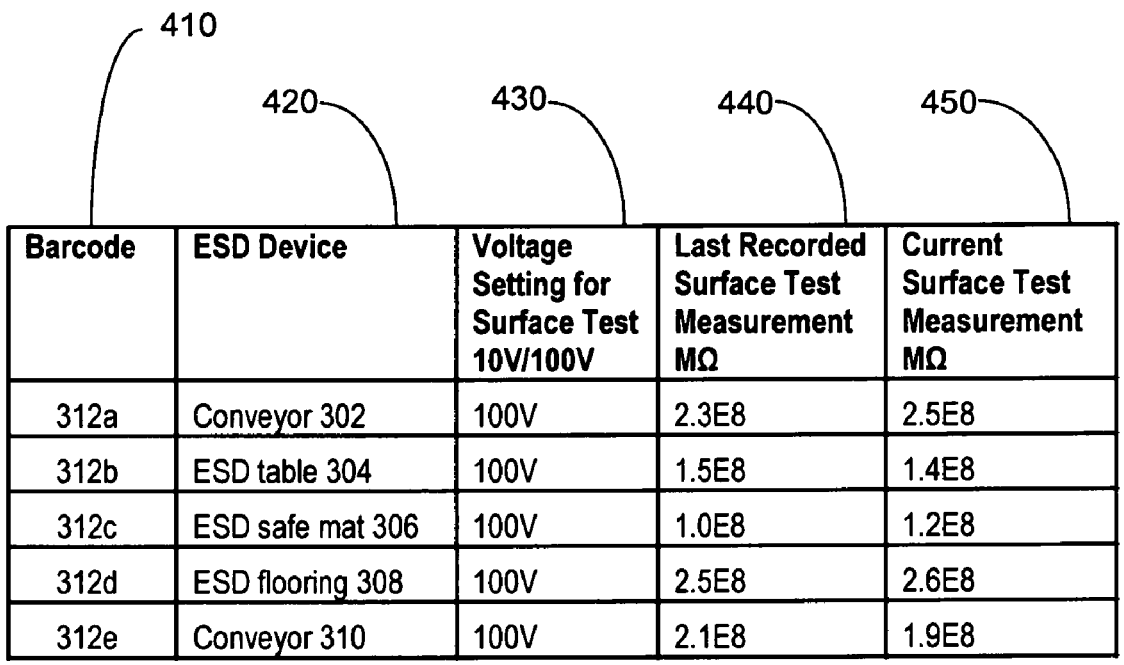
FIG. 4 is an illustrative table of test measurement data stored on the ESD device tester of FIGS. 1A & 1B.

FIG. 4 is an illustrative table of sample test measurement data 400 stored on the ESD device tester of FIG. 1 (e.g. in storage 152). As shown, a first column 410 may include a plurality of unique barcode values that uniquely identify each of the ESD devices 302-310 listed in column 420. A column 430 may specify the appropriate voltage setting for each ESD device in column 420. Another column 440 may store the last recorded surface test measurement for each ESD device in column 420. Another column 450 may store the current surface test measurement for each ESD device in column 420.

In an embodiment, instead of or in addition to a last recorded surface test measurement for each ESD device in column 420, a running average of surface test measurements for each ESD device may be stored. This may allow the ESD specialist to compare the current test measurement for a particular ESD device to an average test measurement taken over a longer period of time (e.g. an average of the last ten measurements).

The data stored in the table in FIG. 4 may allow an ESD specialist to test ESD devices 302-310 more efficiently by uniquely identifying the ESD device 302, 304, 306, 308, 310 to be tested, retrieving and applying any settings for the ESD device tester 100 specific to that ESD device 302, 304, 306, 308, 310, and optionally retrieving a history or average of previous test measurements to validate the current test measurements that are taken.

In another embodiment, temperature sensor 140 and humidity sensor 142 may be used to test environmental conditions in the immediate vicinity of an ESD device being tested and these temperature and humidity measurements may be stored together with the surface resistance measurements to help interpret any variations in surface resistance test measurements.

In a further embodiment, in addition to retrieving data and configuring the ESD device tester 100 in some manner (e.g.

applying specific test settings for the device), user instructions for correct placement of test leads 112, 114 may also be retrieved depending on the type of ESD device in column 420. For example, based on the unique identification provided by the barcode value in column 410, appropriate text instructions may be provided via a display in user interface 158. The text instructions may, for example, guide a user to place test leads 112, 114 on marked test points provided on a type of ESD device. Alternatively, a graphic of the particular ESD device may be provided to visually identify the location of the test contact points to be used for the particular type of ESD device. Rather than being individual to each ESD device, the text instructions or graphic may be stored for a finite number (e.g. 6 to 12) of different kinds of ESD devices that may be tested using ESD device tester 100.

In an embodiment, the data stored in the table in FIG. 4 may be uploaded from ESD device tester 100 to a host server, such as the ESD monitoring and process control server 202 of FIG. 1. This may be done either by connecting ESD device tester 100 directly to server 202 via a suitable connector (e.g. via serial, parallel, universal serial bus (USB), or FireWire), or if ESD device tester 100 is also configured with a wireless communications subsystem 160, then wirelessly via communications network 208 and communications server 206 (FIG. 2).

Figure 5:
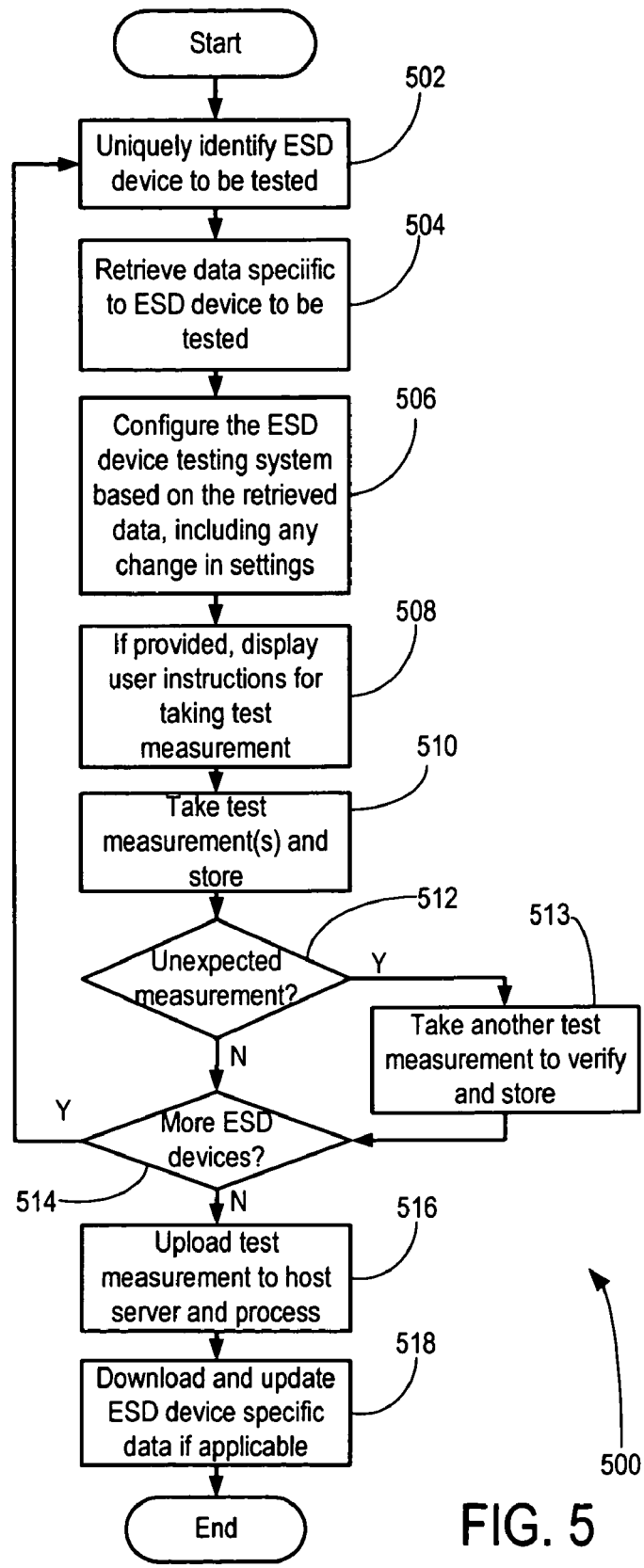
FIG. 5 is a flowchart of an illustrative method in accordance with an embodiment.

FIG. 5 is a flowchart of an illustrative method 500 in accordance with an embodiment corresponding to the above description. At block 502, an ESD specialist may uniquely identify an ESD device to be tested (e.g. using a barcode reader subsystem 130 integrated into ESD device tester 100). Upon unique identification of the ESD device to be tested, method 500 proceeds to block 504, where data specific to the ESD device to be tested may be retrieved (e.g. from non-volatile storage 152). Upon retrieval of the data, method 500 proceeds to block 506 where the ESD device tester 100 is configured based on the retrieved data. This may include, for example, configuring ESD device tester 100 to be ready to accept a test measurement value.

As previously described, the retrieved data may also include a particular setting for the ESD device tester 100 specific to that ESD device. The retrieved data may also include historic measurement data for the ESD device which may include, for example, the last recorded test measurement, or some average of a plurality of previously recorded test measurements.

At block 508, as a test measurement is taken, if the retrieved data includes instructions on how the testing should be performed (e.g. by providing text instructions or a graphic illustration on locating the correct contact points on a particular type of ESD device for testing) the data is displayed to the user so that the testing procedure will remain consistent from one test to the next even if performed by different individuals. This may help to ensure that any variations between successive test measurements are more meaningful.

Method 500 then proceeds to block 510, where one or more test measurements are taken (e.g. by actuating test button 104) and stored. For example, a test measurement may be taken for a surface test, as well as one or more of temperature and humidity.

If the retrieved data also includes historical test measurement data, method 500 may proceed to decision block 512 to determine if the measurement is unexpected (i.e. outside of a predetermined acceptable range of variation). If no, method 500 proceeds directly to decision 514 where, if there are more ESD devices to be tested, method 500 may return to block 502 to uniquely identify the next ESD device. If yes, method 500 may optionally proceed to block 513 to take another measurement to verify the test before proceeding to decision block 514.

At decision block 514, if there are no more ESD devices to be tested, method 500 may proceed to block 516 where the test measurement data stored on ESD device tester 100 may be uploaded to a host server (e.g. ESD monitoring and process control server 202 of FIG. 2) for processing. The processing may include, for example, updating a database of historical test measurement data for every ESD device tested. The historical test measurement data may be analyzed using various statistical methods.

In an embodiment, the result of any processing done on the host server may be downloaded back to the ESD device tester 100 in order to provide the ESD device specific data that may be retrieved during the next ESD testing at the electronics facility. Method 500 then ends.

It will be appreciated that the systems and methods as described above may assist an ESD specialist in conducting testing of numerous ESD devices at a facility in a more efficient manner.

Thus, in an aspect, there is provided a method of operating a portable electrostatic discharge (ESD) device tester, comprising: (i) uniquely identifying an ESD device to be tested using identification means provided on the tester; (ii) taking at least one test measurement of the uniquely identified ESD device using testing means provided on the tester, the testing means being configurable in dependence upon data associated with the uniquely identified ESD device; and (iii) storing the at least one test measurement in a storage means provided in the tester.

In an embodiment, the method further comprises calculating a running average of test measurements for the uniquely identified ESD device.

In another embodiment, the method further comprises comparing the at least one test measurement for the uniquely identified ESD device to the calculated running average of test measurements.

In another embodiment, the method further comprises repeating a test measurement if the at least one test measurement is not within a predetermined range of the running average of test measurements for the uniquely identified ESD device.

In another embodiment, the method further comprises transferring the at least one test measurement to a host server for processing.

In another embodiment, the testing means is a megohmmeter, the test measurement is a surface resistance test, and the method further comprises configuring the voltage to be used for the surface resistance test in dependence upon the uniquely identified ESD device.

In another embodiment, the identification means is one of a barcode reader and a radio frequency identification (RFID) tag reader, and the method further comprises reading a barcode or an RFID tag uniquely identifying an ESD device.

In another aspect of the invention, there is provided a portable electrostatic discharge (ESD) device tester, comprising: identification means for uniquely identifying an ESD device to be tested; testing means for taking at least one test measurement of the uniquely identified ESD device, the testing means being configurable in dependence upon data associated with the uniquely identified ESD device; and storage means for storing the at least one test measurement.

In an embodiment, the system further comprises means for calculating a running average of test measurements for the uniquely identified ESD device.

In another embodiment, the system further comprises means for comparing the at least one test measurement for the uniquely identified ESD device to the calculated running average of test measurements.

In another embodiment, the system further comprises means for repeating a test measurement if the at least one test measurement is not within a predetermined range of the running average of test measurements for the uniquely identified ESD device.

In another embodiment, the system further comprises means for transferring the at least one test measurement to a host server for processing.

In another embodiment, the testing means is a megohmmeter, the test measurement is a surface resistance test, and the system further comprises means for configuring the voltage to be used for the surface resistance test in dependence upon the uniquely identified ESD device.

In another embodiment, the system further comprises means is one of a barcode reader and a radio frequency identification (RFID) tag reader.

In another aspect of the invention, there is provided a computer readable medium storing computer code that when loaded into a portable electrostatic discharge (ESD) device tester adapts the tester to obtain test measurements, the computer readable medium including: code for uniquely identifying an ESD device to be tested using identification means provided on the tester; code for taking at least one test measurement of the uniquely identified ESD device using testing means provided on the tester, the testing means being configurable in dependence upon data associated with the uniquely identified ESD device; and code for storing the at least one test measurement in a storage means provided in the tester.

In an embodiment, the computer readable medium further includes code for calculating a running average of test measurements for the uniquely identified ESD device.

In another embodiment, the computer readable medium further includes code for comparing the at least one test measurement for the uniquely identified ESD device to the calculated running average of test measurements.

In another embodiment, the computer readable medium further includes code for repeating a test measurement if the at least one test measurement is not within a predetermined range of the running average of test measurements for the uniquely identified ESD device.

In another embodiment, the computer readable medium further includes code for transferring the at least one test measurement to a host server for processing.

In another embodiment, the testing means is a megohmmeter, the test measurement is a surface resistance test, and the computer readable medium further includes code for configuring the voltage to be used for the surface resistance test in dependence upon the uniquely identified ESD device.

While illustrative embodiments have been described above, it will be appreciated that various changes and modifications may be made. More generally, the scope of the invention is defined by the following claims.

What is claimed is:

1. A method of operating a portable electrostatic discharge (ESD) device tester to test a plurality of ESD devices at ESD monitored stations within an electronics manufacturing or assembly facility, comprising:
   (i) uniquely identifying an ESD device used in an electronics manufacturing process and to be tested, using identification means provided on the tester;
   (ii) configuring testing means provided on the tester in dependence upon the identity of the uniquely identified ESD device;
   (iii) taking at least one test measurement of the uniquely identified ESD device using the testing means provided on the tester; and
   (iv) storing the at least one test measurement in a storage means provided in the tester.

2. The method of claim 1, further comprising calculating a running average of test measurements for the uniquely identified ESD device.

3. The method of claim 2, further comprising comparing the at least one test measurement for the uniquely identified ESD device to the calculated running average of test measurements.

4. The method of claim 3, further comprising repeating a test measurement if the at least one test measurement is not within a predetermined range of the running average of test measurements for the uniquely identified ESD device.

5. The method of claim 1, further comprising transferring the at least one test measurement to a host server for processing.

6. The method of claim 1, wherein the testing means is a megohmmeter, the test measurement is a surface resistance test, and the method further comprises configuring the voltage to be used for the surface resistance test in dependence upon the uniquely identified ESD device.

7. The method of claim 1, wherein the identification means is one of a barcode reader and a radio frequency identification (RFID) tag reader, and the method comprises reading a barcode or an RFID tag uniquely identifying an ESD device.

8. A portable electrostatic discharge (ESD) device tester to test a plurality of ESD devices at ESD monitored stations within an electronics manufacturing or assembly facility, comprising:
   identification means for uniquely identifying an ESD device at one of the ESD monitored stations within the electronics manufacturing or assembling facility and to be tested;
   testing means for taking at least one test measurement of the uniquely identified ESD device;
   configuration means for configuring the testing means in dependence upon the identity of the uniquely identified ESD device; and
   storage means for storing the at least one test measurement.

9. The system of claim 8, further comprising means for calculating a running average of test measurements for the uniquely identified ESD device.

10. The system of claim 9, further comprising means for comparing the at least one test measurement for the uniquely identified ESD device to the calculated running average of test measurement.

11. The system of claim 10, further comprising means for repeating a test measurement if the at least one test measurement is not within a predetermined range of the running average of test measurements for the uniquely identified ESD device.

12. The system of claim 8, further comprising means for transferring the at least one test measurement to a host server for processing.

13. The system of claim 8 wherein the testing means is a megohmmeter, the test measurement is a surface resistance test, and the system further comprises means for configuring the voltage to be used for the surface resistance test in dependence upon the uniquely identified ESD device.

14. The system of claim 8, wherein the identification means is one of a barcode reader and a radio frequency identification (RFID) tag reader.

15. A computer readable medium storing computer code that when loaded into a portable electrostatic discharge (ESD) device tester adapts the tester to obtain test measurements from a plurality of ESD devices at ESD monitored stations within an electronics manufacturing or assembly facility, the computer readable medium including:

- code for uniquely identifying an ESD device used in an electronics manufacturing process and to be tested, using identification means provided on the tester;
- code for configuring testing means provided on the tester in dependence upon the identity of the uniquely identified ESD device;
- code for taking at least one test measurement of the uniquely identified ESD device using testing means provided on the tester; and
- code for storing the at least one test measurement in a storage means provided in the tester.

16. The computer readable medium of claim 15, further including code for calculating a running average of test measurements for the uniquely identified ESD device.

17. The computer readable medium of claim 16, further including code for comparing the at least one test measurement for the uniquely identified ESD device to the calculated running average of test measurements.

18. The computer readable medium of claim 17, further including code for repeating a test measurement if the at least one test measurement is not within a predetermined range of the running average of test measurements for the uniquely identified ESD device.

19. The computer readable medium of claim 18, further including code for transferring the at least one test measurement to a host server for processing.

20. The computer readable medium of claim 15, wherein the testing means is a megohmmeter, the test measurement is a surface resistance test, and the computer readable medium further includes code for configuring the voltage to be used for the surface resistance test in dependence upon the uniquely identified ESD device.

* * * * *